(12) United States Patent
Lin et al.

(10) Patent No.: US 10,763,391 B2
(45) Date of Patent: Sep. 1, 2020

(54) DISPLAY PANEL, METHOD FOR PROCESSING DEFECTIVE PIXELS THEREOF, DISPLAY DEVICE

(71) Applicant: BOE Technology Group Co., Ltd., Beijing (CN)

(72) Inventors: Yicheng Lin, Beijing (CN); Cuili Gai, Beijing (CN); Baoxia Zhang, Beijing (CN); Ling Wang, Beijing (CN); Quanhu Li, Beijing (CN); Pan Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/182,883

(22) Filed: Nov. 7, 2018

(65) Prior Publication Data

US 2019/0189839 A1 Jun. 20, 2019

(30) Foreign Application Priority Data

Dec. 18, 2017 (CN) .......................... 2017 1 1365870

(51) Int. Cl.
*H01L 33/00* (2010.01)
*G09G 3/00* (2006.01)
(Continued)

(52) U.S. Cl.
CPC ......... *H01L 33/0095* (2013.01); *G09G 3/006* (2013.01); *H01L 27/3276* (2013.01);
(Continued)

(58) Field of Classification Search
CPC ........... G09G 2330/10; G09G 2330/08; G09G 3/006; G09G 2320/02
See application file for complete search history.

(56) References Cited

U.S. PATENT DOCUMENTS

2007/0182914 A1* 8/2007 Hwang ................ G09G 3/2096
349/192
2008/0280458 A1* 11/2008 Tsukihara .......... B23K 26/0648
438/795
(Continued)

FOREIGN PATENT DOCUMENTS

CN 101614916 A 12/2009
CN 105097884 A 11/2015

OTHER PUBLICATIONS

First Office Action and English language translation, CN Application No. 201711365870.9, dated Jan. 20, 2020, 15 pp.

*Primary Examiner* — Syed I Gheyas
(74) *Attorney, Agent, or Firm* — Myers Bigel, P.A.

(57) ABSTRACT

The present disclosure provides a display panel, a display device comprising such a display panel, and a method for processing defective pixels of such a display panel. The display panel comprises: a substrate; a plurality of pixel units on the substrate and arranged in an array. Each of the pixel units includes a light emitting region and a driving circuit region. In each of the pixel units, the driving circuit region includes a transistor, the light emitting region includes a first electrode, and the first electrode is electrically coupled to a first terminal of the transistor. In a row direction or a column direction of the plurality of pixel units arranged in an array, light emitting regions of two adjacent pixel units are adjacent to each other.

19 Claims, 5 Drawing Sheets

(51) Int. Cl.
*H01L 51/00* (2006.01)
*H01L 27/32* (2006.01)
*G09G 3/3225* (2016.01)

(52) U.S. Cl.
CPC ........... *H01L 51/00* (2013.01); *G09G 3/3225* (2013.01); *G09G 2330/10* (2013.01); *H01L 2251/568* (2013.01); *H01L 2933/0066* (2013.01)

(56) References Cited

U.S. PATENT DOCUMENTS

| | | |
|---|---|---|
| 2009/0322978 A1 | 12/2009 | Peng |
| 2014/0110678 A1 | 4/2014 | Jin et al. |
| 2017/0062543 A1 | 3/2017 | Hsin |
| 2018/0210254 A1* | 7/2018 | Wang ................ G02F 1/136286 |

* cited by examiner

DISPLAY PANEL, METHOD FOR PROCESSING DEFECTIVE PIXELS THEREOF, DISPLAY DEVICE

RELATED APPLICATION

The present application claims the benefit of Chinese Patent Application No. 201711365870.9, filed on Dec. 18, 2017, the entire disclosure of which is incorporated herein by reference.

FIELD

The present disclosure generally relates to the field of display, and more particularly to a display panel, a display device comprising such a display panel, and a method for processing defective pixels of such a display panel.

BACKGROUND

Organic light emitting diode (OLED) display technology is a technology that realizes display by using invertible color changes generated by an organic semiconductor material driven by a current. OLED displays have advantages such as ultra-lightness, ultra-thinness, high luminance, large viewing angle, low voltage, low power consumption, fast response, high definition, shock resistance, bendability, low cost, simple process, use of fewer raw materials, high luminous efficiency, wide temperature range, and the like, and are hence considered to be the most promising new-generation display technology.

In the process of manufacturing an OLED display device, yield is one of the main factors currently affecting the manufacturing cost. Unfortunately, since the driving circuit of the OLED display device is relatively complicated, and signal lines and connection lines within pixels are relatively dense, the probability of occurrence of a failure is higher. In particular, presence of defective pixels is a major threat to the yield of an OLED display device. Defective pixels usually refer to pixel points that always display the same color regardless of the image displayed by the display device. In general, defective pixels can be roughly classified into two categories. One is dark spots where content cannot be displayed regardless of how the displayed content changes, and the other is bright spots which are always lit whenever the display device is powered on regardless of how the displayed content changes. Since the bright spots are more visually distinct than the dark spots, a common fix method is to cut off the driving of the bright spots to make them dark spots. However, too many dark spots will still seriously affect the yield of the display device.

Accordingly, there is a need in the art for an improved scheme for processing defective pixels of a display device.

SUMMARY

It is an object of the present disclosure to provide an improved display panel, a display device comprising such a display panel, and a method for processing defective pixels of such a display panel.

According to an aspect of the present disclosure, there is provided a display panel comprising a substrate and a plurality of pixel units on the substrate and arranged in an array. Each of the pixel units includes a light emitting region and a driving circuit region, and in each of the pixel units, the driving circuit region includes a transistor, the light emitting region includes a first electrode, and the first electrode is electrically coupled to a first terminal of the transistor. In a row direction or a column direction of the plurality of pixel units arranged in an array, light emitting regions of two adjacent pixel units are adjacent to each other. The display panel further comprises a maintenance assisting line between the two adjacent pixel units, and an insulating layer between the maintenance assisting line and the first electrode. The maintenance assisting line is configured to electrically couple first electrodes of the two adjacent pixel units in response to poor driving of the light emitting region of one of the two adjacent pixel units.

As used herein, the term "poor driving" refers to a situation in which the driving circuit region of a pixel unit cannot provide a correct driving signal to the light emitting region of the pixel unit according to an image that needs to be displayed due to a circuit failure. For example, if power supply to the driving circuit region is interrupted, the light emitting region of the pixel unit is always unable to be lit, so the pixel unit appears as a dark spot. If the transistor of the driving circuit region is short-circuited, when the display panel is powered on, the first electrode of the pixel unit always receives an active level, so the pixel unit appears as a bright spot.

According to some embodiments of the present disclosure, the two adjacent pixel units have a same color. For example, in an RGB display panel, the two adjacent pixel units may both be red pixel units, green pixel units, or blue pixel units.

According to some embodiments of the present disclosure, the above display panel further comprises a planarization layer on the insulating layer. The maintenance assisting line is between the substrate and the insulating layer, the first electrode is on the planarization layer, and an orthographic projection of the maintenance assisting line on the substrate overlaps orthographic projections of the first electrodes of the two adjacent pixel units on the substrate.

According to some embodiments of the present disclosure, the planarization layer includes a via hole, and an orthographic projection of the via hole on the substrate overlaps the orthographic projection of the maintenance assisting line and the orthographic projections of the first electrodes of the two adjacent pixel units on the substrate.

According to some embodiments of the present disclosure, an orthographic projection of the first electrode of each of the two adjacent pixel units on the substrate overlaps an orthographic projection of the light emitting region thereof on the substrate.

According to some embodiments of the present disclosure, a driving circuit region of an n-th row pixel unit is between the n-th row pixel unit and a (n−1)-th row pixel unit, and a driving circuit region of a (n+1)-th row pixel unit is between the (n+1)-th row pixel unit and a (n+2)-th row pixel unit, n being an odd number greater than or equal to 1.

According to some embodiments of the present disclosure, a driving circuit region of an m-th column pixel unit is between the m-th column pixel unit and a (m−1)-th column pixel unit, and a driving circuit region of a (m+1)-th column pixel unit is between the (m+1)-th column pixel unit and a (m+2)-th column pixel unit, m being an odd number greater than or equal to 1.

According to some embodiments of the present disclosure, orthographic projections of the first electrode and the driving circuit region of each of the pixel units on the substrate overlap each other. In such a display panel, the display panel may have a top emission structure.

According to some embodiments of the present disclosure, the maintenance assisting line is configured to receive laser welding to electrically couple the first electrodes of the two adjacent pixel units in response to poor driving of the light emitting region of one of the two adjacent pixel units.

According to some embodiments of the present disclosure, the maintenance assisting line and a control terminal of the transistor have a same material and are electrically insulated from each other.

According to some embodiments of the present disclosure, the maintenance assisting line has a same material as and is electrically insulated from the first terminal and a second terminal of the transistor.

According to another aspect of the present disclosure, there is provided a display device comprising any of the display panels described above.

According to some embodiments of the present disclosure, the above display device is an active matrix organic light emitting diode (AMOLED) display device.

According to a further aspect of the present disclosure, there is provided a method for processing defective pixels of any of the display panels described above. The method comprises: detecting whether the light emitting regions of the two adjacent pixel units are poorly driven; and electrically coupling the first electrodes of the two adjacent pixel units by the maintenance assisting line in response to detecting that the light emitting region of one of the two adjacent pixel units is poorly driven.

According to some embodiments of the present disclosure, the above method further comprises: cutting off electrical coupling between the first electrode and the driving circuit region of the pixel unit where the light emitting region that is poorly driven resides in response to detecting that the light emitting region of one of the two adjacent pixel units is poorly driven.

According to some embodiments of the present disclosure, the display panel further comprises a planarization layer on the insulating layer, wherein the maintenance assisting line is between the substrate and the insulating layer, the first electrode is on the planarization layer, and an orthographic projection of the maintenance assisting line on the substrate overlaps orthographic projections of the first electrodes of the two adjacent pixel units on the substrate. In such a method for processing defective pixels of a display panel, electrically coupling the first electrodes of the two adjacent pixel units by the maintenance assisting line in response to detecting that the light emitting region of one of the two adjacent pixel units is poorly driven comprises: electrically coupling the maintenance assisting line to the first electrodes of the two adjacent pixel units by laser welding in response to detecting that the light emitting region of one of the two adjacent pixel units is poorly driven.

According to some embodiments of the present disclosure, the planarization layer includes a via hole, and an orthographic projection of the via hole on the substrate overlaps the orthographic projection of the maintenance assisting line and the orthographic projections of the first electrodes of the two adjacent pixel units on the substrate. In such a method for processing defective pixels of a display panel, electrically coupling the maintenance assisting line to the first electrodes of the two adjacent pixel units by laser welding in response to detecting that the light emitting region of one of the two adjacent pixel units is poorly driven comprises: electrically coupling the maintenance assisting line to the first electrodes of the two adjacent pixel units at the via hole by laser welding in response to detecting that the light emitting region of one of the two adjacent pixel units is poorly driven.

According to some embodiments of the present disclosure, the planarization layer includes an organic material.

According to some embodiments of the present disclosure, cutting off electrical coupling between the first electrode and the driving circuit region of the pixel unit where the light emitting region that is poorly driven resides in response to detecting that the light emitting region of one of the two adjacent pixel units is poorly driven comprises: cutting off electrical coupling between the first electrode and the driving circuit region of the pixel unit where the light emitting region that is poorly driven resides by means of laser.

It is to be noted that all the aspects of the present disclosure have similar or identical example implementations and benefits, and are not described herein again.

These and other aspects of the present disclosure will be apparent from and set forth with reference to the embodiments described below.

DETAILED DESCRIPTION

Exemplary embodiments of the present disclosure will be described in detail below with reference to the accompanying drawings. The drawings are illustrative and not drawn true to scale, which are merely intended to illustrate embodiments of the present disclosure rather than limit the scope of the present disclosure. In the drawings, the same reference numerals are used to refer to the same or similar parts. In order to make the technical solutions of the present disclosure clearer, the process steps and device structures well known in the art are omitted herein.

For convenience of description, spatially relative terms such as "under", "below", "lower", "above", "upper" and the like may be used herein to describe the relationship between one element or component and another element or component shown in the drawings. It will be understood that the spatially relative terms are used to summarize different orientations of a device in use or operation in addition to the orientation shown in the drawings. For example, if a device in the drawings is turned over, an element described as being "under" or "below" another element or component will be "above" another element or component. Thus, the illustrative term "below" can encompass two orientations of "above" and "under". The device may take other orientations (rotated 90 degrees or in other orientations) and the spatially relative descriptors used herein should be interpreted accordingly.

Figure 1:
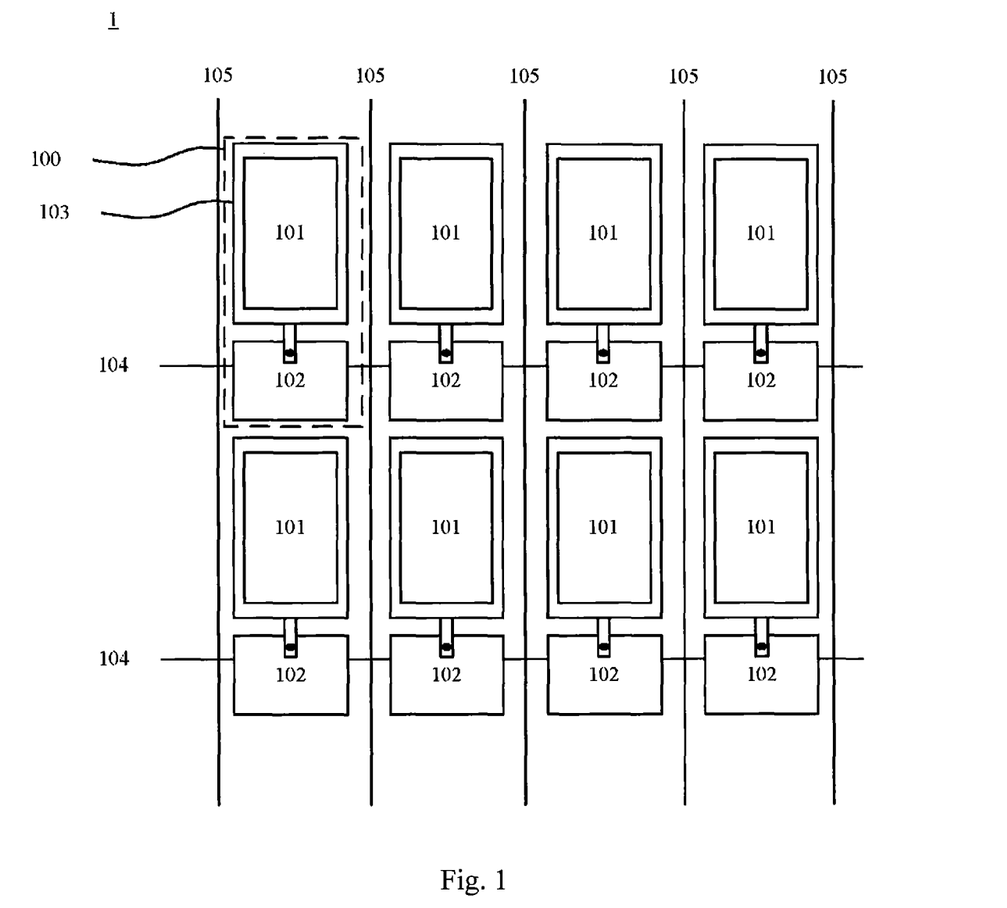
FIG. 1 schematically illustrates a top view of a conventional OLED display panel.

FIG. 1 schematically illustrates a top view of a conventional OLED display panel. As shown in FIG. 1, a display panel 1 comprises a plurality of pixel units 100 arranged in an array. Each of the pixel units 100 includes a light emitting region 101 and a driving circuit region 102. In each of the pixel units 100, the driving circuit region 102 includes a transistor (not shown), the light emitting region 101 includes a first electrode 103, and the first electrode 103 is electrically coupled to a first terminal of the transistor. A plurality of scan signal lines 104 and a plurality of data lines 105 extend in an intersecting manner and are electrically insulated from each other, and the respective pixel units 100 are defined at intersections of the plurality of scan signal lines 104 and the plurality of data lines 105. Each scan signal line 104 is configured to apply a scan signal to the driving circuit region 102 of a corresponding pixel unit 100 to turn on the driving circuit region 102, and each data line 105 is configured to apply a data signal to the driving circuit region 102 of a corresponding pixel unit 100, so that the driving circuit region 102 drives a corresponding light emitting region 101 to realize display.

As known to those skilled in the art, a source and a drain of a transistor are generally symmetrical, thus one of the source and the drain of the transistor is referred to herein as a "first terminal" of the transistor. Accordingly, the other of the source and the drain of the transistor can be referred to as a "second terminal" of the transistor. Additionally, a gate of the transistor is referred to herein as a "control terminal" of the transistor.

The transistor may be a thin film transistor or other types of transistors as known to those skilled in the art.

In the OLED display panel shown in FIG. 1, the light emitting regions 101 and the driving circuit regions 102 of the pixel units 100 are arranged alternately in a longitudinal direction. When the light emitting region 101 of a certain pixel unit 100 becomes a bright spot due to poor driving, the driving of the light emitting region 101 by the driving circuit region 102 of the pixel unit 100 is cut off by laser cutting to make it a dark spot. However, when the light emitting region 101 of a certain pixel unit 100 becomes a dark spot due to poor driving, the dark spot cannot be processed. Moreover, too many dark spots will seriously affect the yield and display effect of the display panel.

Figure 2A:
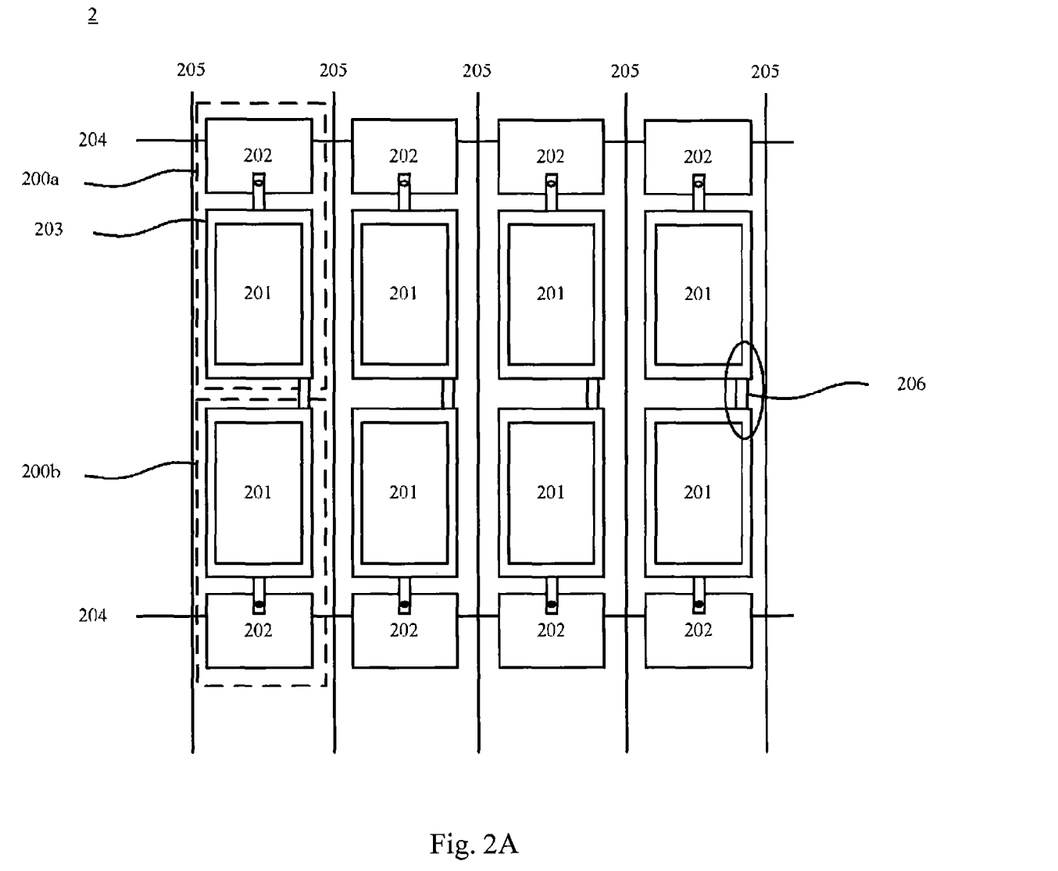
FIGS. 2a and 2b schematically illustrate a top view of an OLED display panel according to an embodiment of the present disclosure, respectively.
Figure 2B:
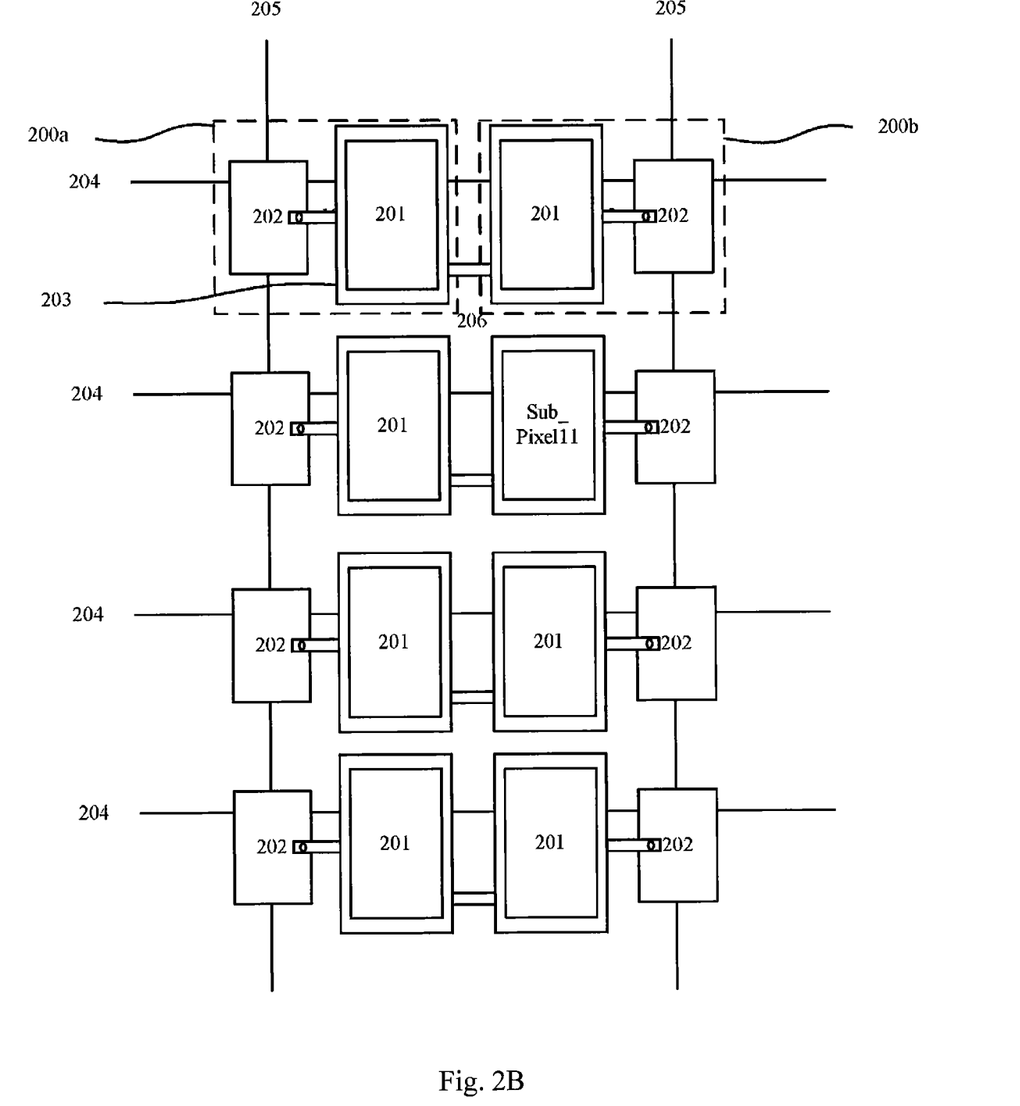

FIGS. 2a-2b schematically illustrate a top view of an OLED display panel according to an embodiment of the present disclosure, respectively. As shown in FIGS. 2a-2b, a display panel 2 comprises a substrate (not shown), and a plurality of pixel units 200 on the substrate and arranged in an array. Each of the pixel units 200 includes a light emitting region 201 and a driving circuit region 202. In each of the pixel units 200, the driving circuit region 202 includes a transistor (not shown), the light emitting region 201 includes a first electrode 203, and the first electrode 203 is electrically coupled to a first terminal of the transistor. Light emitting regions 201a and 201b of two adjacent pixel units 200a and 200b are adjacent to each other in a row direction or a column direction (a column direction in FIG. 2a, a row direction in FIG. 2b) of the plurality of pixel units 200 arranged in an array. The display panel 200 further comprises a maintenance assisting line 206 between the two adjacent pixel units 200a and 200b, and an insulating layer (not shown in FIGS. 2a-2b) between the maintenance assisting line 206 and the first electrode 203. The maintenance assisting line 206 is configured to electrically couple first electrodes 203a and 203b of the two adjacent pixel units 200a and 200b in response to poor driving of the light emitting region (e.g. the light emitting region 201a of the pixel unit 200a) of one of the two adjacent pixel units (e.g. the pixel unit 200a).

A plurality of scan signal lines 204 and a plurality of data lines 205 extend in an intersecting manner and are electrically insulated from each other, and the respective pixel units 200 are defined at intersections of the plurality of scan signal lines 204 and the plurality of data lines 205. The scan signal line 204 is configured to apply a scan signal to the driving circuit region 202 of a corresponding pixel unit 200 to turn on the driving circuit region 202, and the data line 205 is configured to apply a data signal to the driving circuit region 202 of a corresponding pixel unit 200, so that the driving circuit region 202 drives a corresponding light emitting region 201 to realize display.

In FIG. 2a, a driving circuit region 202 of an n-th row pixel unit 200 is between the n-th row pixel unit 200 and a (n−1)-th row pixel unit 200, and a driving circuit region 202 of a (n+1)-th row pixel unit 200 is between the (n+1)-th row pixel unit 200 and a (n+2)-th row pixel unit 200, where n is an odd number greater than or equal to 1.

In the embodiment shown in FIG. 2a, the light emitting regions of every two adjacent rows of pixel units are adjacent to each other and separated from the light emitting regions of other rows of pixel units by means of the driving circuit regions. In such a display panel, the display panel may have a bottom emission structure. By providing a maintenance assisting line between two adjacent rows of pixel units whose light emitting regions are adjacent to each other, bright spots and dark spots in the display panel can be eliminated, thereby improving the yield and display effect of the display panel.

In FIG. 2b, a driving circuit region 202 of an m-th column pixel unit 200 is between the m-th column pixel unit 200 and a (m−1)-th column pixel unit 200, and a driving circuit region 202 of a (m+1)-th column pixel unit 200 is between the (m+1)-th column pixel unit 200 and a (m+2)-th column pixel unit 200, where m is an odd number greater than or equal to 1.

In the embodiment shown in FIG. 2b, the light emitting regions of every two adjacent columns of pixel units are adjacent to each other and separated from the light emitting regions of other columns of pixel units by means of the driving circuit regions. In such a display panel, the display panel may have a bottom emission structure. By providing a maintenance assisting line between two adjacent columns of pixel units whose light emitting regions are adjacent to each other, bright spots and dark spots in the display panel can be eliminated, thereby improving the yield and display effect of the display panel.

In the display panel provided by an embodiment of the present disclosure, the light emitting regions of two adjacent pixel units in the row direction or the column direction are designed to be adjacent to each other. Under normal circumstances, the first electrodes of the pixel units are separated from each other and electrically insulated, so that the data lines apply different electrical signals to the first electrodes of the pixel units respectively, so as to make the pixel units display different brightnesses, thereby realizing display of different images. However, if the light emitting region of one of the two adjacent pixel units is poorly driven, the first electrodes of the two adjacent pixel units may be electrically coupled by a maintenance assisting line between the two adjacent pixel units, such that the first electrode of the pixel unit whose light emitting region is poorly driven receives the electrical signal applied to the first electrode of its adjacent pixel unit, thus the pixel unit whose light emitting region is originally poorly driven can still be driven. In this way, there are no dark spots or bright spots in the display panel that seriously affect the display effect. Moreover, since the pixel unit is minute compared to the entire display panel, the user hardly perceives an abnormality macroscopically, so that the yield and display effect of the display panel can be improved significantly.

In an exemplary embodiment, the two adjacent pixel units 200a and 200b may have the same color. In such an embodiment, when the light emitting region of one of the two adjacent pixel units is poorly driven, the two adjacent pixel units can be driven identically and display the same color and brightness. Therefore, in particular, the display effect of a solid color displayed image can be significantly improved.

Figure 3:
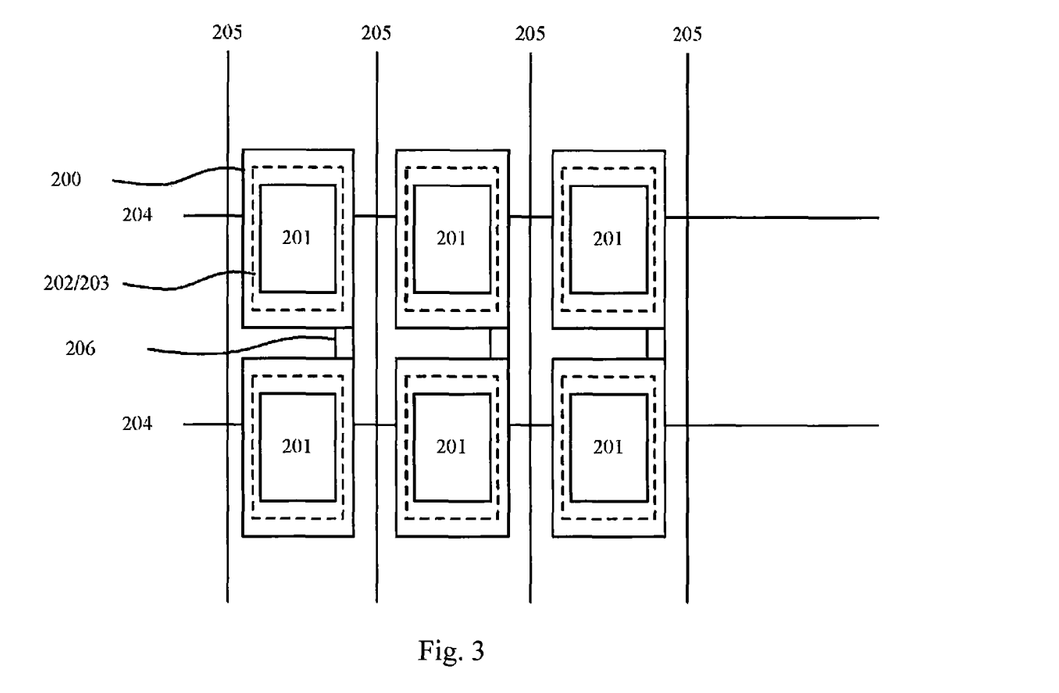
FIG. 3 schematically illustrates a top view of an OLED display panel according to another embodiment of the present disclosure.

FIG. 3 schematically illustrates a top view of an OLED display panel according to another embodiment of the present disclosure. The difference from the OLED display panel shown in FIG. 2 lies in that in FIG. 3 the orthographic projections of the first electrode 203 and the driving circuit region 202 of each pixel unit 200 on the substrate overlap, but in FIGS. 2a and 2b the light emitting region 201 and the driving circuit region 202 of each pixel unit 200 are arranged in the row direction or the column direction. In such a display panel, the display panel may have a top emission structure. As will be appreciated by those skilled in the art, in the OLED display panel shown in FIG. 3, the maintenance assisting line 206 may be between two pixel units 200 which are adjacent in the column direction and have adjacent light emitting regions, or as shown in FIG. 3, the maintenance assisting line may be between two pixel units which are adjacent in the row direction and have adjacent light emitting regions.

Figure 4A:
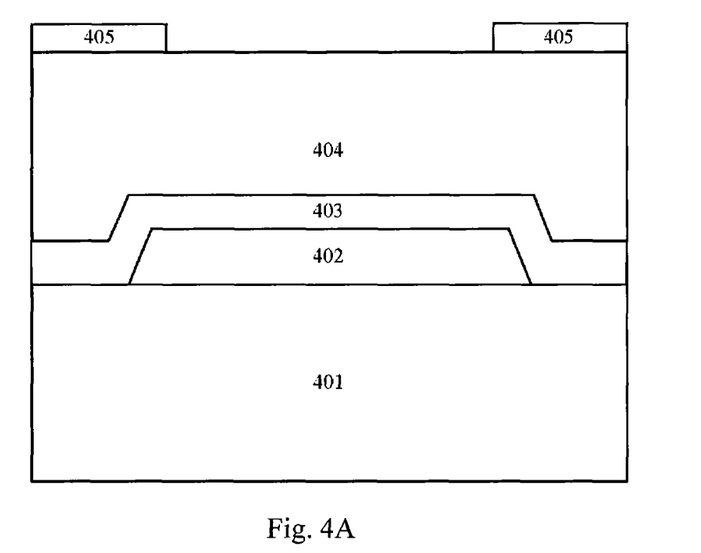
FIGS. 4a and 4b schematically illustrate a sectional view of a portion of an OLED display panel according to an embodiment of the present disclosure, respectively.

FIG. 4a schematically illustrates a sectional view of a portion (e.g. an elliptical region in FIG. 2a) of an OLED display panel according to an embodiment of the present disclosure which includes a maintenance assisting line. As shown in FIG. 4a, a display panel 4 comprises a substrate 401, a maintenance assisting line 402 on the substrate 401, an insulating layer 403 on the maintenance assisting line 402, a planarization layer 404 on the insulating layer 403, and first electrodes 405 of two adjacent pixel units on the planarization layer 404, wherein orthographic projections of the first electrode 405 and the maintenance assisting line 402 on the substrate 401 overlap. The planarization layer 404 is configured to provide a flat surface for a light emitting unit to be subsequently fabricated.

In an OLED display device, in order to achieve a uniform display effect, it is generally required to fabricate a light emitting unit on a flat surface. To this end, a planarization layer is provided on the insulating layer to provide a flat surface for the light emitting unit to be subsequently fabricated.

Figure 4B:
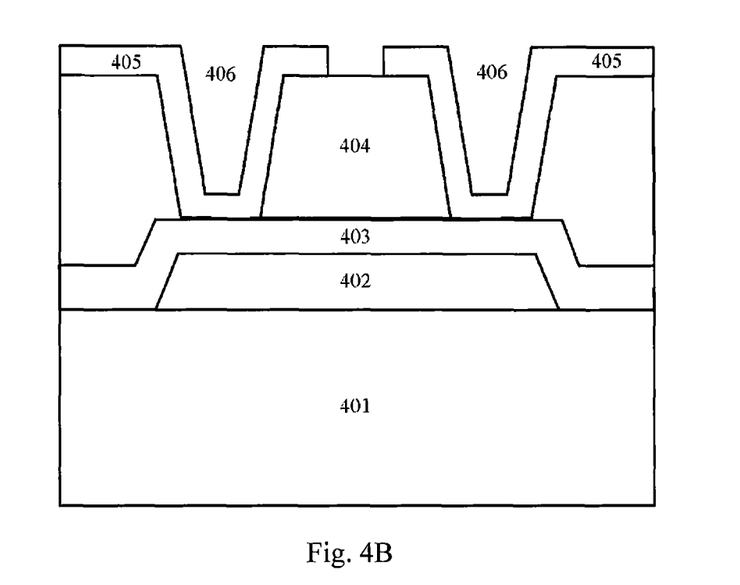

FIG. 4b schematically illustrates a sectional view of a portion (e.g. an elliptical region in FIG. 2a) of an OLED display panel according to another embodiment of the present disclosure which includes a maintenance assisting line. The difference from FIG. 4a is that the planarization layer 404 includes a via hole 406, wherein the orthographic projection of the via hole 406 on the substrate 401 overlaps the orthographic projections of the maintenance assisting line 402 and the first electrode 405 on the substrate 401.

In an embodiment of the present disclosure, conductive materials of the first electrodes of the two adjacent pixel units may be passed through the planarization layer and the insulating layer by laser welding, and electrically coupled to the maintenance assisting line. However, if an organic material is used to form the planarization layer, the organic material will disadvantageously absorb the laser light, thereby affecting the efficiency of laser welding. Therefore, a via hole penetrating the planarization layer may be provided at a position where laser welding needs to be performed so as to prevent the laser light from being absorbed by the planarization layer.

Accordingly, in an exemplary embodiment, the maintenance assisting line may be configured to receive laser welding to electrically couple the first electrodes of the two adjacent pixel units in response to poor driving of the light emitting region of one of the two adjacent pixel units.

In an example embodiment, the orthographic projections of the first electrode and the light emitting region of each of the two adjacent pixel units on the substrate may overlap.

In particular, the maintenance assisting line and the control terminal of the transistor may have the same material and be electrically insulated from each other. Therefore, the maintenance assisting line and the control terminal of the transistor can be simultaneously formed in the same process step, thereby simplifying the manufacturing process and reducing the manufacturing cost.

Alternatively, the maintenance assisting line and the first and second terminals of the transistor may have the same material and be electrically insulated from each other. Therefore, the maintenance assisting line and the first and second terminals of the transistor can be simultaneously formed in the same process step, thereby simplifying the manufacturing process and reducing the manufacturing cost.

Further, in an embodiment of the present disclosure, the display panel is an organic light emitting diode (OLED) display panel. Specifically, the display panel comprises a pixel defining layer on the first electrode, a light emitting layer, and the like, and may further comprise an encapsulation layer, and the like.

Further, the present disclosure provides a display device comprising any of the display panels described above. Such a display device may be an organic light emitting diode (OLED) display device, and may further be an active matrix organic light emitting diode (AMOLED) display device.

In such a display device, the light emitting regions of two adjacent pixel units in the row direction or the column direction are designed to be adjacent to each other. Under normal circumstances, the first electrodes of the pixel units are separated from each other and electrically insulated, so that different electrical signals are applied to the first electrodes of the pixel units respectively, so as to make the pixel units display different brightnesses, thereby realizing display of different images. However, if the light emitting region of one of the two adjacent pixel units is poorly driven, the first electrodes of the two adjacent pixel units may be electrically coupled by a maintenance assisting line between the two adjacent pixel units such that the first electrode of the pixel unit whose light emitting region is poorly driven receives the electrical signal applied to the first electrode of its adjacent pixel unit, thus the pixel unit whose light emitting region is originally poorly driven can still be driven. In this way, there are no dark spots or bright spots in the display panel that seriously affect the display effect. Moreover, since the pixel unit is minute compared to the entire display panel, the user hardly perceives an abnormality macroscopically, so that the yield and display effect of the display panel can be improved significantly.

Figure 5:
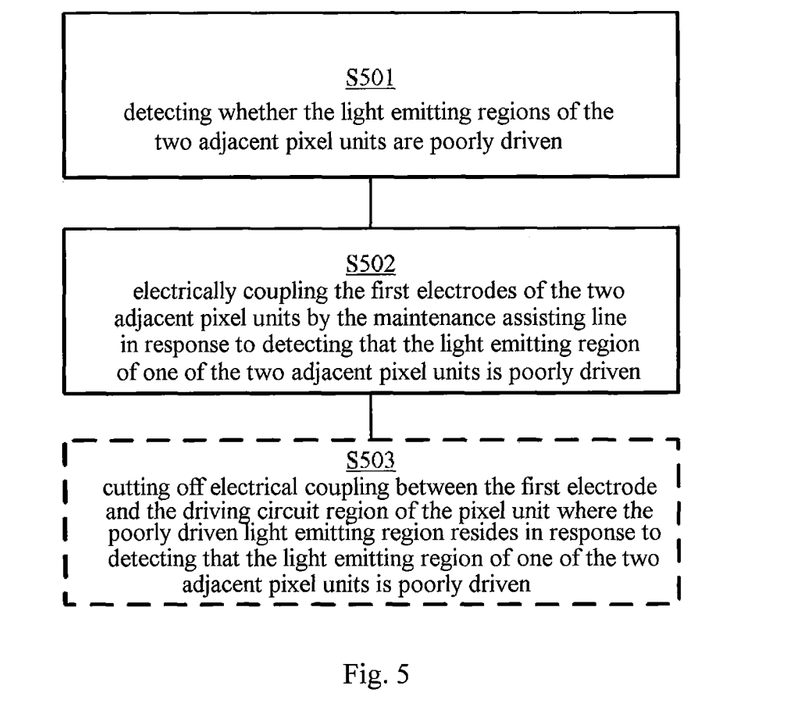
FIG. 5 schematically illustrates a flowchart of a method for processing defective pixels of a display panel according to an embodiment of the present disclosure.

The present disclosure further provides a method for processing defective pixels of any of the display panels described above. As shown in FIG. 5, the method for processing defective pixels may comprise: in step S501, detecting whether the light emitting regions of the two adjacent pixel units are poorly driven; and in step S502, electrically coupling the first electrodes of the two adjacent pixel units by the maintenance assisting line in response to detecting that the light emitting region of one of the two adjacent pixel units is poorly driven.

Optionally, the method for processing defective pixels may further comprise: in step S503, cutting off electrical coupling between the first electrode and the driving circuit region of the pixel unit where the poorly driven light emitting region resides in response to detecting that the light emitting region of one of the two adjacent pixel units is poorly driven. Cutting off electrical coupling between the first electrode and a corresponding driving circuit region could eliminate the influence of faulty driving circuit region on the light emitting region, thereby further improving the yield and display effect of the display panel.

When the display panel comprises a planarization layer on the insulating layer, the maintenance assisting line may be electrically coupled to the first electrodes of the two adjacent pixel units by laser welding in response to detecting that the light emitting region of one of the two adjacent pixel units is poorly driven.

Further, when the planarization layer includes a via hole, and an orthographic projection of the via hole on the substrate overlaps the orthographic projection of the maintenance assisting line and the orthographic projections of the first electrodes of the two adjacent pixel units on the substrate, the maintenance assisting line may be electrically coupled to the first electrodes of the two adjacent pixel units at the via hole by laser welding in response to detecting that the light emitting region of one of the two adjacent pixel units is poorly driven.

Specifically, the above step S503 may comprise: cutting off, by laser, electrical coupling between the first electrode and the driving circuit region of the pixel unit where the poorly driven light emitting region resides.

In the method for processing defective pixels of a display panel as described above, if it is detected that the light emitting region of one of the two adjacent pixel units is poorly driven, the first electrodes of the two adjacent pixel units are electrically coupled by the maintenance assisting line between the two adjacent pixel units such that the first electrode of the pixel unit whose light emitting region is poorly driven receives the electrical signal applied to the first electrode of its adjacent pixel unit, thus the pixel unit whose light emitting region is originally poorly driven can still be driven. In this way, there are no dark spots or bright spots in the display panel that seriously affect the display effect. Moreover, since the pixel unit is minute compared to the entire display panel, the user hardly perceives an abnormality macroscopically, so that the yield and display effect of the display panel can be improved significantly.

The concept of the present disclosure may be widely applied to any system having a display function, including a desktop computer, a laptop computer, a television, a mobile phone, a tablet computer, and the like. In addition, while several embodiments have been described in detail above, other modifications are possible. For example, components may be added to or removed from the described system. Other embodiments may be within the scope of the present disclosure. In view of the teachings of the present disclosure, numerous variations and modifications may be made by those skilled in the art without departing from the spirit and scope of the present disclosure.

What is claimed is:

1. A display panel comprising:
    a substrate;
    a plurality of pixel units on the substrate and arranged in an array, wherein ones of the plurality of pixel units comprise a light emitting region and a driving circuit region, wherein the driving circuit region comprises a transistor, wherein the light emitting region comprises a first electrode, and wherein the first electrode is electrically coupled to a first terminal of the transistor, wherein in one of a row direction and a column direction of the plurality of pixel units arranged in the array, the light emitting regions of every two adjacent rows or columns of the pixel units are adjacent to each other and separated from the light emitting regions of other rows or columns of the pixel units by the driving circuit regions;
    a maintenance assisting line between the pixel units that are adjacent to each other; and
    an insulating layer between the maintenance assisting line and the first electrode,
    wherein the maintenance assisting line is configured to electrically couple the first electrode of the pixel units that are adjacent to each other in response to poor driving of the light emitting region of one of the pixel units that are adjacent to each other, and
    wherein the maintenance assisting line is directly on the substrate and the insulating layer is directly on the maintenance assisting line.

2. The display panel according to claim 1, wherein the pixel units that are adjacent to each other have a same color.

3. The display panel according to claim 1, further comprising:
    a planarization layer on the insulating layer,
    wherein the maintenance assisting line is between the substrate and the insulating layer,
    wherein the first electrode is on the planarization layer, and
    wherein an orthographic projection of the maintenance assisting line on the substrate overlaps an orthographic projection of the first electrode of one of the pixel units that are adjacent to each other on the substrate.

4. The display panel according to claim 3, wherein the planarization layer comprises a via hole, an orthographic projection of the via hole on the substrate overlapping the orthographic projection of the maintenance assisting line and the orthographic projection of the first electrode of the one of pixel units that are adjacent to each other on the substrate.

5. The display panel according to claim 1, wherein respective orthographic projections of the first electrode of each of the pixel units that are adjacent to each other on the substrate overlap an orthographic projection of the light emitting region thereof on the substrate.

6. The display panel according to claim 5,
    wherein a driving circuit region of an n-th row pixel unit is between the n-th row pixel unit and a (n−1)-th row pixel unit,
    wherein a driving circuit region of a (n+1)-th row pixel unit is between the (n+1)-th row pixel unit and a (n+2)-th row pixel unit, and
    wherein n is an odd number greater than or equal to 1.

7. The display panel according to claim 5,
    wherein a driving circuit region of an m-th column pixel unit is between the m-th column pixel unit and a (m−1)-th column pixel unit,
    wherein a driving circuit region of a (m+1)-th column pixel unit is between the (m+1)-th column pixel unit and a (m+2)-th column pixel unit, and
    wherein m is an odd number greater than or equal to 1.

8. The display panel according to claim 1, wherein the maintenance assisting line is configured to receive laser welding to electrically couple the first electrode of the pixel units that are adjacent to each other in response to the poor driving of the light emitting region of one of the pixel units that are adjacent to each other.

9. The display panel according to claim 1, wherein the maintenance assisting line and a control terminal of the transistor comprise a same material and are electrically insulated from each other.

10. The display panel according to claim 1, wherein the maintenance assisting line comprises a same material as and is electrically insulated from the first terminal and a second terminal of the transistor.

11. A display device comprising the display panel according to claim 1.

12. The display device according to claim 11, wherein the display device comprises an active matrix organic light emitting diode display device.

13. A method for processing defective pixels of a display panel comprising a substrate, an insulating layer, and pixel units, wherein the pixel units are adjacent to one another, wherein ones of the pixel units comprise respective light emitting regions and respective driving circuit regions, the method comprising:
   detecting whether a first light emitting region and a second light emitting region of respective ones of the pixel units that are adjacent to each other are poorly driven; and
   electrically coupling respective first electrodes of the pixel units that are adjacent to each other to a maintenance assisting line in response to detecting that the light emitting region of one of the pixel units that are adjacent to each other is poorly driven,
   wherein in one of a row direction and a column direction of the plurality of pixel units arranged in the array, the light emitting regions of every two adjacent rows or columns of the pixel units are adjacent to each other and separated from the light emitting regions of other rows or columns of the pixel units by the driving circuit regions,
   wherein the maintenance assisting line is directly on the substrate and the insulating layer is directly on the maintenance assisting line.

14. The method according to claim 13, further comprising:
   cutting off electrical coupling between a respective one of the first electrodes and the respective driving circuit region of a first pixel unit of the pixel units comprising the first light emitting region or the second light emitting region that is poorly driven, in response to detecting that the first light emitting region or the second light emitting region of the pixel units that are adjacent to each other is poorly driven.

15. The method according to claim 13,
   wherein the display panel further comprises a planarization layer on the insulating layer,
   wherein the maintenance assisting line is between the substrate and the insulating layer,
   wherein the first electrodes are on the planarization layer,
   wherein an orthographic projection of the maintenance assisting line on the substrate overlaps orthographic projections of the respective first electrodes of the pixel units that are adjacent to each other, and
   wherein the electrically coupling the respective first electrodes of the pixel units that are adjacent to each other to the maintenance assisting line comprises electrically coupling the maintenance assisting line to a respective one of the first electrodes of the pixel units that are adjacent to each other by laser welding, in response to detecting that the first light emitting region or the second light emitting region of the pixel units that are adjacent to each other is poorly driven.

16. The method according to claim 15,
   wherein the planarization layer comprises a via hole,
   wherein an orthographic projection of the via hole on the substrate overlaps the orthographic projection of the maintenance assisting line and the orthographic projections of the respective first electrodes of the pixel units that are adjacent to each other on the substrate, and
   wherein electrically coupling the maintenance assisting line to the first electrode of the pixel units that are adjacent to each other by laser welding comprises electrically coupling the maintenance assisting line to the respective first electrodes of the pixel units that are adjacent to each other at the via hole by laser welding, in response to detecting that the first light emitting region or the second light emitting region of the pixel units that are adjacent to each other is poorly driven.

17. The method according to claim 16, wherein the planarization layer comprises an organic material.

18. The method according to claim 14, wherein the cutting off electrical coupling between the respective one of the first electrodes and the respective driving circuit region of the first pixel unit of the pixel units comprises:
   cutting off electrical coupling between the respective one of the first electrodes and the respective driving circuit region of the first pixel unit of the pixel units comprising the first light emitting region or the second light emitting region that is poorly driven, using a laser.

19. The display device according to claim 11, wherein the pixel units that are adjacent to each other have a same color.

\* \* \* \* \*